(12) United States Patent
Kawakami et al.

(10) Patent No.: US 9,937,555 B2
(45) Date of Patent: Apr. 10, 2018

(54) SILVER POWDER

(71) Applicant: SUMITOMO METAL MINING CO., LTD., Tokyo (JP)

(72) Inventors: Yuji Kawakami, Ehime (JP); Akihiro Murakami, Ehime (JP); Toshiaki Terao, Ehime (JP); Isao Kaneko, Ehime (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 250 days.

(21) Appl. No.: 14/650,161

(22) PCT Filed: Oct. 2, 2013

(86) PCT No.: PCT/JP2013/076817
§ 371 (c)(1),
(2) Date: Jun. 5, 2015

(87) PCT Pub. No.: WO2014/087728
PCT Pub. Date: Jun. 12, 2014

(65) Prior Publication Data
US 2015/0314370 A1  Nov. 5, 2015

(30) Foreign Application Priority Data
Dec. 5, 2012 (JP) .................. 2012-266627

(51) Int. Cl.
| | | |
|---|---|---|
| B22F 1/00 | (2006.01) |
| C22C 5/06 | (2006.01) |
| H01B 5/00 | (2006.01) |
| H05K 1/09 | (2006.01) |
| H01B 1/02 | (2006.01) |
| H01B 1/22 | (2006.01) |
| B22F 9/24 | (2006.01) |

(52) U.S. Cl.
CPC .......... B22F 1/0003 (2013.01); B22F 1/0011 (2013.01); B22F 1/0096 (2013.01);
(Continued)

(58) Field of Classification Search
None
See application file for complete search history.

(56) References Cited

U.S. PATENT DOCUMENTS 7,345,105 B2* 3/2008 Yoshino ................ H05K 3/321
524/439
2005/0172483 A1* 8/2005 Sugita ...................... H01B 1/22
29/830

(Continued)

FOREIGN PATENT DOCUMENTS

JP  2000-129318 A  5/2000
JP  2004-100013 A  4/2004
(Continued)

OTHER PUBLICATIONS

Nov. 12, 2013 International Search Report issued in International Patent Application No. PCT/JP2013/076817.

*Primary Examiner* — Devang R Patel
(74) *Attorney, Agent, or Firm* — Oliff PLC

(57) ABSTRACT

The present invention provides a silver powder that has an appropriate viscosity range at the time of paste production, can be easily kneaded, and prevents flake occurrence. The silver powder has a dibutyl phthalate absorption amount, measured by a method of JIS-K6217-4, of 7.0 to 9.5 ml/100 g, and has an oil absorption profile at the time of measurement of the absorption amount, having two peaks, or one peak having a half width of not more than 1.5 ml/100 g.

4 Claims, 3 Drawing Sheets

(52) U.S. Cl.
CPC ............... *B22F 9/24* (2013.01); *C22C 5/06* (2013.01); *H01B 1/02* (2013.01); *H01B 1/22* (2013.01); *H01B 5/00* (2013.01); *H05K 1/09* (2013.01); *H05K 1/092* (2013.01); *B22F 2998/10* (2013.01); *H05K 2201/02* (2013.01); *H05K 2201/032* (2013.01)

(56) References Cited

U.S. PATENT DOCUMENTS

| | | | | |
|---|---|---|---|---|
| 2007/0164260 | A1* | 7/2007 | Kuwajima | H01B 1/02 252/512 |
| 2009/0233237 | A1* | 9/2009 | Yoshiki | H05K 3/106 430/311 |
| 2014/0306167 | A1* | 10/2014 | Terao | H01B 1/02 252/514 |

FOREIGN PATENT DOCUMENTS

| | | |
|---|---|---|
| JP | 2004-197030 A | 7/2004 |
| JP | 2004-265901 A | 9/2004 |
| JP | 2005-149913 A | 6/2005 |
| JP | 2010-053409 A | 3/2010 |
| JP | 2011-001581 A | 1/2011 |
| JP | 2013-096008 A | 5/2013 |
| WO | 2012/169628 A1 | 12/2012 |
| WO | 2012/176831 A1 | 12/2012 |

\* cited by examiner

SILVER POWDER

FIELD OF THE INVENTION

The present invention relates to a silver powder, more specifically, relates to a silver powder serving as a main component of a silver paste used for forming a wiring layer, an electrode, and the like of an electronic apparatus. The present application claims priority based on Japanese Patent Application No. 2012-266627 filed in Japan on Dec. 5, 2012. The total contents of the patent application are to be incorporated by reference into the present application.

BACKGROUND ART

To form a wiring layer, an electrode, and the like of an electronic apparatus, silver pastes, such as a resin type silver paste and a baked type silver paste, have been widely used. In other words, these silver pastes are applied to or printed on various kinds of substrates, and then heat-cured or heat-baked, whereby a conductive film to serve as a wiring layer, an electrode, or the like can be formed.

For example, the resin type silver paste comprises a silver powder, a resin, a curing agent, a solvent, and the like, and is printed on a conductor circuit pattern or on a terminal, and heat-cured at a temperature of 100° C. to 200° C. to be made into a conductive film, whereby wiring or an electrode is formed. On the other hand, the baked type silver paste comprises a silver powder, glass, a solvent, and the like, and is printed on a conductor circuit pattern or on a terminal, and heat-baked at a temperature of 600° C. to 800° C. to be made into a conductive film, whereby wiring or an electrode is formed. In the wiring and the electrodes formed of these silver pastes, an electric current path in which an electrical connection is established by linkages between the silver powders is formed.

The silver powder to be used for the silver paste has a particle diameter of 0.1 µm to a few µm, and the particle diameter of the silver powder to be used differs depending on the thickness of a wiring or an electrode to be formed. Furthermore, uniform dispersion of the silver powder in the paste enables the formation of wiring having a uniform thickness or the formation of an electrode having a uniform thickness.

Generally, a silver paste is produced in such a manner that, for example, first, a silver powder is preliminarily kneaded smoothly with other components such as a solvent, and then kneaded with a predetermined pressure being applied using a three-roll mill or the like. This manner enables a large amount of a silver paste to be produced at a time, whereby higher productivity and an effect of production cost reduction can be expected. Meanwhile, a silver powder is required to be efficiently kneaded by a roller, in other words, required to have good kneadability.

A paste having a too high or too low viscosity is difficult to efficiently knead by a three-roll mill. A silver powder having a low viscosity causes a shearing stress in a three-roll mill to be smaller and causes a shearing force applied to a silver paste to be smaller, and accordingly the silver powder is insufficiently dispersed in the paste. On the other hand, a silver powder having a high viscosity is difficult to knead smoothly with other components such as a solvent, and consequently, a paste obtained by insufficiently kneading the silver powder with other components such as a solvent is fed into a three-roll mill.

In the case where a silver powder is insufficiently dispersed in a paste, or in the case where the viscosity of a paste is decreased due to insufficient kneading of a silver powder with other components such as a solvent, aggregate masses of silver particles are present in the paste. When such paste is kneaded by a three-roll mill, the aggregate masses of the silver particles are crushed, whereby a coarse powder such as a powder in the form of a thin piece having a few mm size (flakes) is generated. It is not desirable to leave the generated flakes in the paste as they are, and therefore the flakes are sieved using a mesh or the like and removed. Too much amount of flakes generated cause troubles such as clogging of the mesh with the coarse powder, whereby the flakes cannot be efficiently removed, and productivity is considerably reduced.

Furthermore, in the case where flakes occur in a paste as mentioned above, when screen-printing is conducted using that paste, a fine screen is clogged up with the coarse flakes, thereby causing difficulties in accurate printing of a pattern.

Thus, the flake occurrence at the time of paste production has a great impact on printability in screen-printing. Therefore, it is desired that a silver powder has a viscosity enough to be easily kneaded at the time of paste production and has good dispersibility in a solvent, and also has strength enough not to cause masses of silver particles to be crushed during the kneading.

To make paste production easier, the control of the particle size distribution of a silver powder and the form thereof has been proposed.

For example, Patent Literature 1 proposes a conductive adhesive agent in which 30% to 98% by weight of a silver powder is blended as a conductive powder with a resin for a binder. The silver powder whose primary particles have a flat shape and which has a massive aggregation structure having a tap density of not more than 1.5 $g/cm^3$ is contained in the conductive adhesive agent.

According to Patent Literature 1, the silver powder having the aggregation structure has high dispersibility enough to be easily released from aggregation and changed into primary particles, and, without causing the deterioration of conductivity due to poor dispersion of the silver powder, stable electrical conductivity can be generated, and there can be obtained a conductive adhesive agent which realizes a curing material excellent in not only conductivity but also adhesiveness, heat resistance, moisture resistance, workability, and thermal conductivity.

However, this proposal does not consider the occurrence of coarse flakes caused by a change in the viscosity of a paste or re-aggregation of silver particles dispersed in the paste, and hence it is difficult to say that the dispersibility in a finally-obtained paste is secured.

Patent Literature 2 proposes the addition of a nonionic surface active agent having an HLB value of 6 to 17 to a silver-complex-containing solution. This aims to prevent the aggregation of reduced silver particles at the time of the addition of a reducing agent. Patent Literature 2 proposes a method for producing a silver powder wherein the addition rate of a solution containing a reducing agent is made higher, that is, not less than 1 equivalent per minute, whereby there is obtained a silver powder having a tap density of not less than 2.5 $g/cm^3$, a mean particle diameter of 1 to 6 µm, and a specific surface area of not more than 5 $m^2/g$, and being excellent in dispersibility.

However, this proposal is to prevent the aggregation of an obtained silver powder, thereby achieving a dispersed silver powder, but, does not consider the dispersibility of a silver powder in a solvent and the occurrence of flakes at the time of paste production.

Patent Literature 3 proposes a conductive paste, comprising: conductive particles having a mean particle diameter of 0.5 to 20 μm and a specific surface area of 0.07 to 1.7 m²/g and containing aggregating particles having a degree of aggregation of 1.05 to 3.90 (the degree of aggregation=the mean diameter of the aggregating particles/the mean diameter of primary particles); and a binder containing a thermosetting resin as a main component.

According to this proposal, a conductive paste having good flowability and dispersibility is obtained, conductive particles are stably filled in a via and stably come in contact with each other inside the via hole, and high-quality via hole conductors can be stably formed with less variation.

However, this proposal aims at the filling property of the paste into a via and high connection-reliability, and does not consider the dispersibility of a silver powder itself in a solvent and the occurrence of flakes at the time of paste production. Furthermore, the proposal defines only the degree of aggregation, and does not define whether the degree of aggregation is based on aggregates (which are in face-contact and have high strength) or based on agglomerates (which are in point-contact and have weak strength), and thus does not consider the occurrence of flakes.

Patent Literature 4 defines that the mean particle diameter $D_{IA}$ of primary particles observed using a scanning electron microscope is not more than 0.6 μm and the ratio $D_{50}/D_{IA}$ is not more than 1.5, where $D_{50}$ is a mean particle diameter determined by a particle-size-distribution measurement method using laser diffraction scattering, and thus Patent Literature 4 proposes a silver powder having excellent dispersibility. Such silver powder having excellent dispersibility could reduce the viscosity in a solvent at the time of paste production and cause the occurrence of flakes.

Patent Literature 5 defines that the $D_{50}/D_{IA}$ is not more than 5. According to this definition, in the measurement of particle size distribution, the value $(MT-D_{50})$ in (water+a surface active agent) is not less than 5 μm, and accordingly, flakes could occur in a solvent at the time of paste production.

As mentioned above, there have been proposed improvements in the dispersibility of a silver powder in a paste and the conductivity and reliability of an electrode and wiring which are formed using the paste. However, the prevention of flake occurrence at the time of paste production has not been proposed.

Prior-Art Documents

Patent Document

Patent document 1: Japanese Patent Application Laid-Open No. 2004-197030
Patent document 2: Japanese Patent Application Laid-Open No. 2000-129318
Patent document 3: Japanese Patent Application Laid-Open No. 2004-265901
Patent document 4: Japanese Patent Application Laid-Open No. 2004-100013
Patent document 5: Japanese Patent Application Laid-Open No. 2005-149913

SUMMARY OF THE INVENTION

Problems to be Solved by the Invention

In view of such conventional actual circumstances, an object of the present invention is to provide a silver powder which has an appropriate viscosity range at the time of paste production, can be easily kneaded, and prevents the occurrence of flakes.

Means to Solve the Problem

To achieve the foregoing object, the present inventors earnestly made a study and consequently found that the prevention of a change in the viscosity of a paste enables the viscosity at the time of paste production to be maintained within an appropriate range, whereby kneading can be easily performed and the kneadability is improved. Furthermore, the present inventors found that the oil absorption profile of a silver powder at the time of measuring a dibutyl phthalate absorption amount is made to have a specific form, whereby the viscosity change at the time of paste production can be prevented, and the inventors thus accomplished the present invention.

That is, a silver powder of the present invention has a dibutyl phthalate absorption amount, measured by a method of JIS-K6217-4, of 7.0 to 9.5 ml/100 g, and has an oil absorption profile at the time of measurement of the absorption amount, the profile having two peaks, or one peak having a half width of not more than 1.5 ml/100 g.

In the case where the oil absorption profile of the silver powder of the present invention has two peaks, the torque values of the peaks preferably satisfy a relationship P2≤0.75P1, and the absorption amounts at the peaks satisfy a relationship P2<P1, where P1 represents a peak having the highest torque and P2 represents a peak having the second highest torque.

In the silver powder of the present invention, the dibutyl phthalate absorption amount is preferably 7.5 to 8.5 ml/100 g.

The silver powder of the present invention preferably has an area ratio $SA_{BET}/SA_{SEM}$ of 0.6 to 0.8, the area ratio being obtained in such a manner that a specific surface area $(SA_{BET})$ measured by the BET method is divided by a specific surface area $(SA_{SEM})$ calculated from a primary-particle diameter $(D_{SEM})$ measured using a scanning electron microscope.

The silver powder of the present invention preferably has a degree of aggregation $D_{50}/D_{SEM}$ of 1.5 to 4.0, the degree being obtained in such a manner that a volume integral 50% diameter $(D_{50})$ measured by a particle-size-distribution measurement method using laser diffraction scattering is divided by a primary-particle diameter $(D_{SEM})$ measured using a scanning electron microscope.

Effects of Invention

The silver powder according to the present invention allows the viscosity of a paste to be controlled to be in an appropriate range at the time of paste production, and the viscosity change is prevented, and accordingly, kneading can be appropriately and easily performed. Furthermore, the silver powder according to the present invention allows the occurrence of aggregate masses of silver particles to be prevented, and the occurrence of flakes to be prevented, and accordingly, kneadability and printability can be improved.

Furthermore, the silver powder according to the present invention not only has excellent dispersibility in a paste, but also allows a wiring layer and an electrode which are formed of a resin-type silver paste or a baked-type silver paste using this silver powder to be excellent in uniformity and conductivity, and thus, the silver powder has a great industrial value as a powder for a silver paste used to form a wiring layer and an electrode of an electronic apparatus.

DETAILED DESCRIPTION OF THE INVENTION

Hereinafter, a specific embodiment of the silver powder according to the present invention will be described in detail. It should be noted that the present invention is not limited to only the following embodiment, and various changes may be suitably made within the scope not deviating from the gist of the present invention.

<Silver Powder>

Figure 1:
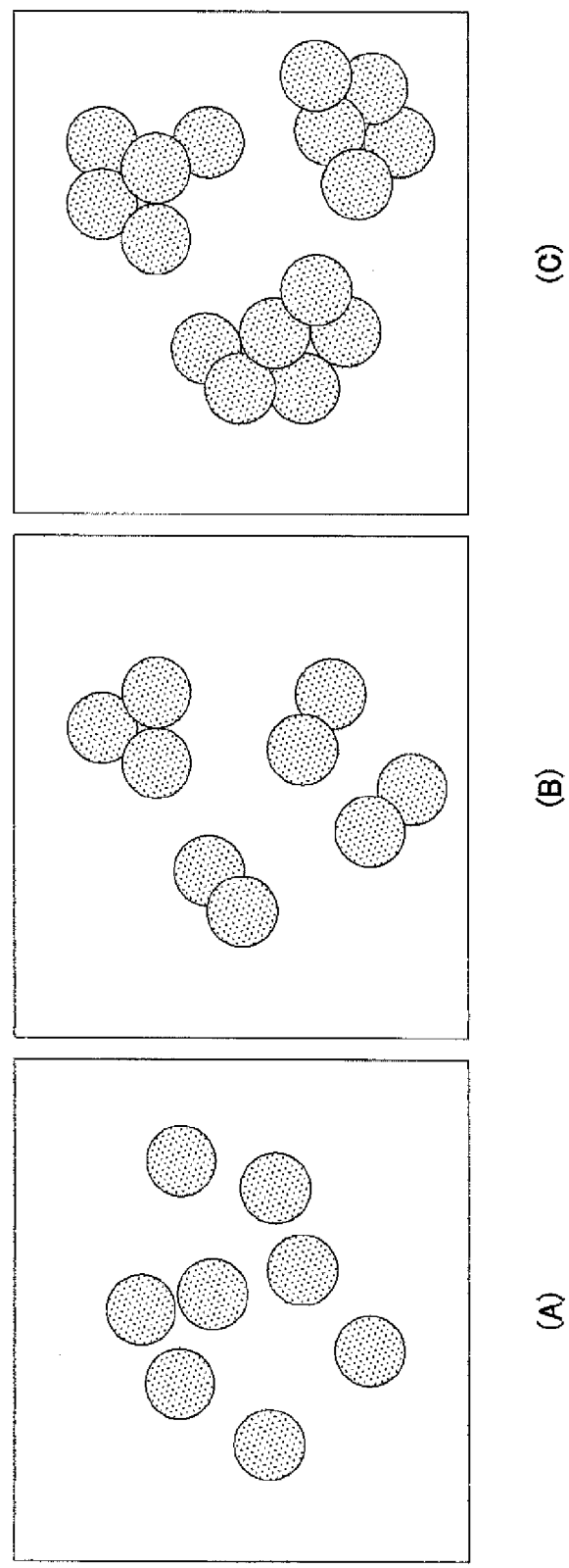
FIG. 1 schematically illustrates the forms of silver particles of the silver powder according to the present invention.

The silver powder includes not only silver particles as primary particles, but also secondary particles and aggregates. In the following description, as illustrated in FIG. 1 (A), the primary particles represent silver particles regarded as a unit particle when judged from a geometric form of the silver particles in terms of appearance, on the other hand, as illustrated in FIG. 1 (B), the secondary particles represent particles which are such that not less than two to three primary particles are connected to each other by necking. As illustrated in FIG. 1 (C), the aggregates represent aggregates of the primary particles and the secondary particles. It should be noted that, in the following description, the primary particles, the secondary particles, and the aggregates are sometimes collectively called silver particles.

The present inventors found that, to achieve a silver powder paste having an appropriate viscosity and good kneadability, a silver powder needs to be an aggregate having a certain aggregation strength. That is, a silver powder present in a paste comprises primary particles, secondary particles formed of a plurality of the primary particles connected each other, and aggregates formed by the aggregation of the primary particles and the secondary particles and having an appropriate strength (hereinafter, referred to as aggregates), and the silver powder and an organic solvent are present in the paste in a state they are unlikely to be separated from each other, and accordingly, the formation of coarse aggregate masses caused by excessive aggregation in the paste is prevented, and the viscosity of the paste is more easily adjusted and the kneadability is also improved.

Conventionally, in the production of a silver paste, there has been used a silver powder in which primary particles are independently dispersed as much as possible and which has a mean particle diameter of 0.1 to 1.5 μm. However, in the case of such fine silver particles in which primary particles are dispersed, the particles easily aggregate at the time of paste production, thereby forming coarse masses. In those aggregate masses, primary particles have more contact points with other primary particles and accordingly voids are less formed, and therefore, a solvent component of the paste hardly enters between the primary particles, and accordingly the apparent amount of the solvent freely flowing in the paste is increased. Therefore, the viscosity of the paste is decreased, and accordingly, for example, in the case where kneading is performed by a three-roll mill, which is generally used for paste production, shearing force is smaller, whereby kneading is insufficiently performed. As a result, it was found that aggregate masses enter a roller as they are without being broken, and consequently, coarse particles of the order of mm, such as flakes, are formed.

On the other hand, it was found that, in the case of a silver powder comprising mainly aggregates (like agglomerates) formed of primary particles or secondary particles which aggregate a weak aggregation strength, the aggregates are broken at the time of paste production; the foregoing state in which the primary particles are dispersed is caused; and coarse particles of the order of mm, such as flakes, are formed.

On the other hand, in the case of a silver powder in which the foregoing aggregates having an appropriate strength, the primary particles, and the secondary particles are mixed, an appropriate amount of a solvent component freely flows in a paste at the time of paste production, whereby the paste has an appropriate range of viscosity. Furthermore, the aggregates remain even after the paste production, and accordingly, kneading of the silver powder with other components such as a solvent and kneading by a three-roll mill can be easily performed, and furthermore, no coarse flake occurs.

The aggregates have, for example, a grape-cluster-like shape, and have a size of approximately 2 to 10 μm. At an early stage of paste production, that is, at a stage of mixing a silver powder with a solvent component smoothly, for example, at a preliminary kneading stage in a general method for paste production in which the preliminary kneading using an agitating type kneader or the like and a main kneading using a three-roll mill or the like are conducted, a paste having an appropriate viscosity (hereinafter, the paste is referred to as a kneaded material to distinguish the material from a finally-obtained paste) is formed without the aggregation of fine primary particles and with the solvent component entering between the particles constituting the silver powder. The main kneading of such kneaded material allows a sufficient shearing force to be applied between the silver particles, and accordingly allows the silver particles to be dispersed in the paste without aggregating. Furthermore, sufficiently dispersed silver particles hardly aggregate again, and therefore, the occurrence of flakes due to coarse aggregate masses can be prevented.

Also in a conventional silver powder containing primary particles dispersed therein, or a silver powder comprising mainly aggregates, kneading to appropriately adjust the viscosity of a kneaded material and finally form a paste can be conducted, but, the adjustment of the viscosity of the kneaded material makes a subsequent viscosity change larger, and accordingly, it becomes difficult to adjust the viscosity of a final paste to an appropriate value.

Too high or too low viscosity of a final silver paste does not achieve a good printability of the paste. A silver powder including the mixture of aggregates, primary particles, and secondary particles even after paste production, that is, a silver powder having the foregoing degree of aggregation allows the viscosity of the paste to be appropriately adjusted. Furthermore, the use of such silver powder makes it possible to achieve a paste having excellent printability.

Furthermore, at the time of paste kneading, the control of the oil absorption amount and the oil absorption profile of a silver powder enables a viscosity change at the time of the paste kneading to be prevented, and the occurrence of flakes as coarse particles to be prevented and the viscosity range to be appropriately maintained. The oil absorption profile of such silver powder has one sharp peak having a narrow half width as illustrated in Example 1 in FIG. 3 because the silver powder has aggregates having an appropriate size. On the other hand, the profile of a silver powder including small aggregates has one broad peak having a wide half width as illustrated in Comparative Example 1 in FIG. 3, and furthermore, the profile of a silver powder having a higher degree of aggregation has two peaks as illustrated in Example 2 in FIG. 3. Furthermore, the higher degree of aggregation leads to the more amount of absorption.

Here, as a means for measuring the size and the amount of aggregates, oil absorption amount as an index can be mentioned. Specifically, the measurement is conducted in accordance with Japanese Industrial Standard (JIS) K6217-4 (2008).

According to JIS K6217-4, a dropping amount obtained when a dibutyl phthalate ester is dropped and a torque value reaches 70% of the maximum torque is regarded as an oil absorption amount (hereinafter, referred to as just an absorption amount). It was confirmed that the oil absorption amount is proportional to the size and the amount of aggregates.

The torque mentioned here is a torque applied to a jig which agitates a silver powder. When a dibutyl phthalate ester starts to be dropped, the dibutyl phthalate ester is incorporated into the inside of the aggregates (oil absorption), and when the dibutyl phthalate ester is gradually filled in the inside and then no longer incorporated thereinto, the dibutyl phthalate ester forms a film on the surfaces of the aggregates. In the case of particles having no aggregate, the dibutyl phthalate ester is not incorporated thereinto and forms a film on the surfaces of the particles. The contact between the particles is established via this liquid film, and the Laplace pressure is generated there, thereby causing an adsorption action between the particles, and the action appears as a torque applied to a jig accordingly, and a change of the torque with the amount of the oil dropping is measured as an oil absorption profile. When the surfaces of the particles are coated with the liquid film, the torque is increased, and furthermore, when an excessive dibutyl phthalate ester is supplied thereto, the liquid enters between the films, the Laplace pressure rapidly decreases, and the torque applied to the jig is reduced. That is, when a dibutyl phthalate ester is dropped, a dropping amount indicating the maximum torque appears. This maximum torque indicates a total of the interactions between the aggregates and the dispersed particles, and hence it can be said that a higher value of the torque indicates a silver powder in which there is a higher interaction between the particles. This interaction causes the high viscosity of a paste at the time when a shearing force is not applied, and, when a shearing force exceeding this torque is applied like at the time of printing, a particle structure formed by the interaction collapses and the paste changes into a low viscous fluid.

Actually, a smaller particle diameter, a larger specific surface area and a higher affinity of the particles for a solvent lead to a higher apparent torque. Hence, in the case of focusing on the characteristics of a powder surface, the maximum torque per unit specific surface area can more reflect the characteristics of the powder surface. In other words, the use of a value obtained by dividing the maximum torque by a specific surface area enables the ascertainment of the characteristics of powders having different particle diameters.

A silver powder according to an embodiment of the present invention has a dibutyl phthalate absorption amount, measured by the JIS-K6217-4 method, of 7.0 to 9.5 ml/100 g. The absorption amount is preferably 7.5 to 8.5 mL. Such silver powder can improve the kneadability.

In the case where the absorption amount is less than 7.0 ml/100 g, when the silver powder is made into a paste using a three-roll mill, the viscosity of the paste is not maintained, whereby flakes occur. On the other hand, in the case where the absorption amount is more than 9.5 ml/100 g, the viscosity at the time of preliminary kneading is high, thereby leading to lower workability, whereby the viscosity after the silver powder is made into a paste is also too high. When the silver powder is made into a paste using a three-roll mill, preliminary kneading is performed using a kneader or the like before main kneading using a three-roll mill, and hence, workability in preliminary kneading is important.

Furthermore, the oil absorption profile of the silver powder at the time of the measurement of the absorption amount has two peaks, or one peak having a half width (full width at half maximum) of not more than 1.5 ml/100 g. The oil absorption profile is dominated by particle surface properties, such as the degree of aggregation, particle size distribution, and specific surface area, and, the control of the oil absorption profile enables a viscosity change at the time of paste production to be prevented. For example, in a silver powder which has a lower degree of aggregation and in which silver particles are dispersed or a silver powder which has a large specific surface area, the oil absorption profile has a peak shifted to the lower absorption amount side or has a broad peak.

When the half width of a peak in an oil absorption profile exceeds 1.5 ml/100 g, the profile is such that the peak gradually rises from a low absorption amount side and a torque value rises shortly, and a torque rapidly decreases in a state where the absorption amount is low. In other words, paste viscosity decreases even in a smaller absorption amount, and therefore, when a paste is formed, the viscosity thereof cannot be maintained, whereby flakes occur.

On the other hand, in the silver powder according to the present embodiment whose oil absorption profile has one peak having a half width of not more than 1.5 ml/100 g, the torque decreases at the point where the absorption amount is larger. Therefore, the viscosity is maintained in an appropriate range without decreasing even during paste kneading, and accordingly, flake occurrence is prevented, whereby good kneadability is achieved. To improve the kneadability, it is preferable that the torque decreases in a state where the absorption amount is larger, and hence, an oil absorption profile preferably has one peak having a half width of not more than 1.5 ml/100 g.

In an oil absorption profile, torque values gradually vary with increase in absorption amount. Therefore, a variation in torque that increases and decreases at a width of 0.5 ml/100 g in the absorption amount is judged to be a peak. A small torque variation within a width of 0.5 ml/100 g is not judged to be a peak. Hence, usually, the foregoing half width never becomes less than 0.5 ml/100 g.

Furthermore, in the case where an oil absorption profile has two peaks, the torque values of the peaks preferably satisfy a relationship $P2 \leq 0.75P1$, and the absorption amounts at the peaks preferably satisfy a relationship $P2 < P1$, where P1 represents a peak having the highest torque and P2 represents a peak having the second highest torque. This allows the torque to decrease in a state where the absorption amount is larger. When the torque values of the peaks satisfy $P2 > 0.75P1$ and/or $P2 \geq P1$, the torque sometimes rapidly decreases in a state where the absorption amount is low, and such silver powder has a risk that flakes occur when the silver powder is made into a paste.

Furthermore, the silver powder according to the present embodiment preferably has an area ratio $SA_{BET}/SA_{SEM}$ of from 0.6 to 0.8, more preferably from 0.65 to 0.75, the area ratio $SA_{BET}/SA_{SEM}$ being obtained by dividing a specific surface area $SA_{BET}$ measured by the BET method by a specific surface area $SA_{SEM}$ calculated from a primary-particle diameter $D_{SEM}$ measured using a scanning electron microscope.

An area ratio of less than 0.6 causes low workability at the time of preliminary kneading and also causes too high viscosity after a silver powder is made into a paste, on the other hand, an area ratio of more than 0.8 causes a viscous property not to be maintained when a silver powder is made into a paste by a three-roll mill, whereby flakes occur.

Figure 2:
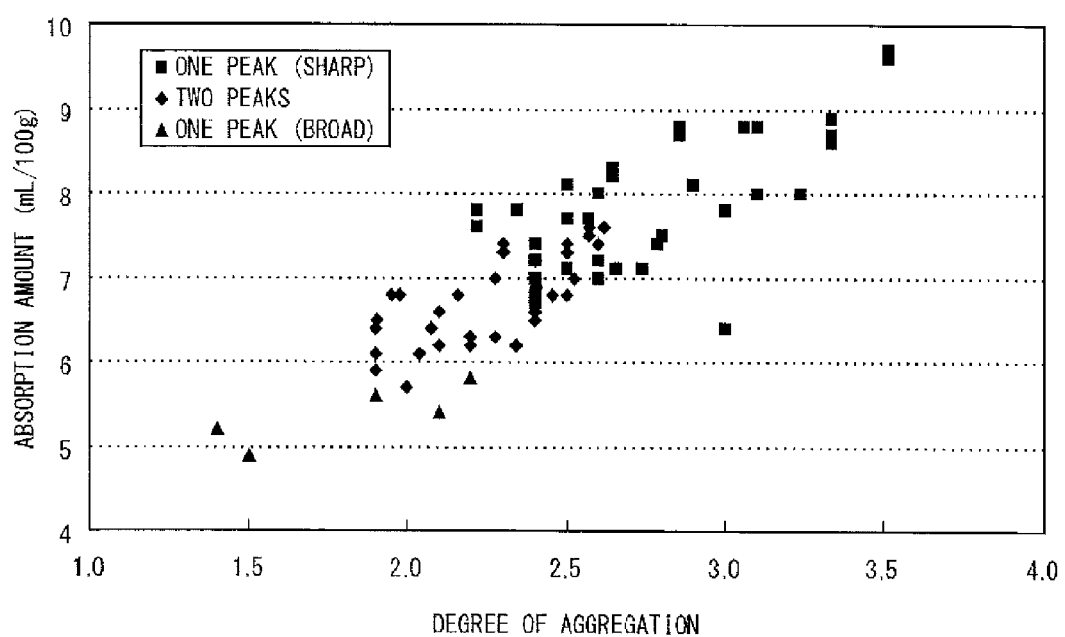
FIG. 2 illustrates a relationship between the degree of aggregation of silver particles and the absorption amount.

Furthermore, a silver powder preferably has a degree of aggregation of 1.5 to 4.0, more preferably 2.5 to 3.5, the degree of aggregation being obtained by dividing a volume integral 50% diameter $D_{50}$ measured by a particle-size-distribution measurement method using laser diffraction scattering by a primary particle diameter $D_{SEM}$ measured using an image observed by a scanning electron microscope. A degree of aggregation of less than 1.5 causes a viscous property not to be maintained when a silver powder is made into a paste by a three-roll mill, whereby flakes occur, on the other hand, a degree of aggregation of more than 4.0 causes low workability at the time of preliminary kneading and also causes too high viscosity after a silver powder is made into a paste. Furthermore, the absorption amount is affected by the surface state of silver particles, and also affected by the degree of aggregation, and, as shown in FIG. 2, a lower degree of aggregation tends to lead to a smaller absorption amount, whereas a higher degree of aggregation tends to lead to a larger absorption amount. It should be noted that, in FIG. 2, an oil absorption profile represented by ■ has one sharp peak; an oil absorption profile represented by ♦ has two peaks; and an oil absorption profile represented by ▲ has one broad peak having a wide half width.

Therefore, to determine the degree of aggregation of a silver powder, $D_{50}$ which is determined using a particle size distribution on a volume basis is needed. Here, a particle size distribution on a volume basis can be obtained by measurement using, for example, a laser diffraction scattering method. When a cumulative curve is determined with the total volume, measured by laser diffraction scattering, of all groups being taken as 100%, a particle diameter obtained at the point of 50% of the cumulative curve is regarded as $D_{50}$.

The silver powder according to the present embodiment is not limited to the application to a specific silver paste, but is applicable to all silver pastes which have been commonly used. Specifically, in the case where a conductive silver paste is produced using the silver powder according to the present embodiment, the viscosity of the paste at a shear rate of 4.0 (1/sec), measured by, for example, a cone-plate type viscometer, is 50 to 150 Pa·s. Furthermore, the viscosity at a shear rate of 20.0 (1/sec) is 20 to 50 Pa·s.

In the case of a silver powder that causes a silver paste produced therewith to have a lower viscosity than the foregoing range, bleeding, drips, and the like occur in wiring and the like which are formed by printing using the silver paste, and thus the shapes of the wiring and the like sometimes cannot be maintained. On the other hand, in the case of a silver powder that causes a silver paste produced therewith to have a higher viscosity than the foregoing range, it is sometimes difficult to conduct printing using the silver paste.

Furthermore, the silver powder according to the present embodiment which has the foregoing excellent paste characteristics can effectively prevent the formation of coarse aggregate masses caused by excessive aggregation, even in a silver paste which has been commonly used.

That is, in a silver powder which causes excessive aggregation in a silver paste and causes the formation of coarse aggregate masses accordingly, flakes formed of the crushed aggregate masses occur. Furthermore, in a silver powder containing excessive aggregates, the viscosity at the time of paste production is too high, thereby causing difficulties in kneading and the like, whereby a problem arises in the paste production. Furthermore, the thus-produced silver paste has poor paste characteristics such as poor printability. The silver powder according to the present embodiment allows the production of a paste having an appropriate viscosity mentioned above, and therefore, excessive aggregation is prevented, whereby a problem caused by the formation of coarse aggregate masses can be effectively prevented.

It should be noted that, in the production of a silver paste by using the silver powder according to the present embodiment which has the foregoing characteristics, a method for making the silver powder into a paste is not particularly limited, and a well-known method may be employed. For example, as a vehicle to be used, there may be used a material obtained by dissolving various kinds of cellulose, phenol resin, acrylic resin, or the like in a solvent, such as an alcoholic solvent, an ether-based solvent, or an ester-based solvent.

<Method for Producing a Silver Powder>

Next, a method for producing a silver powder having the foregoing characteristics will be described.

The method for producing the silver powder is, for example, such that, basically, a silver-complex-containing solution, obtained by dissolving a starting material such as silver chloride in a complexing agent, is mixed with a reducing agent solution to reduce the silver complex and precipitate silver particles, whereby a silver particle slurry is obtained, and the slurry undergoes the steps of washing, drying, and pulverizing, whereby the silver powder is obtained.

In the method for producing the silver powder, 1.0% to 3.8% by mass, more preferably 1.0% to 3.5% by mass of a water soluble polymer with respect to silver is added to the reducing agent solution to reduce the silver complex.

Furthermore, in the method for producing the silver powder, when performing the steps of washing, drying, and pulverizing after the silver particle slurry is obtained by reducing the silver complex with the reducing agent solution, after the drying, the pulverization is performed with weak agitation using a rolling agitator having a vacuum reduced-pressure atmosphere, or the like.

As mentioned above, 1.0% to 3.8% by mass, more preferably 1.0% to 3.5% by mass of a water soluble polymer with respect to silver is added to the reducing agent solution to reduce the silver complex, and also, an obtained silver particle slurry is dried, and then pulverized with weakly agitated, whereby the aggregation state and the specific surface area of silver particles can be controlled; the amount of dibutyl phthalate absorbed can be controlled to 7.0 to 9.5 ml/100 g as mentioned above; and there can be obtained a silver powder having an oil absorption profile at the time of the measurement of the absorption amount, the profile having two peaks, or one peak having a half width (full width at half maximum) of not more than 1.5 ml/100 g.

Hereinafter, taking a case where silver chloride is used as a starting material as a preferable aspect in the method for producing the silver powder, each of the steps will be more specifically described. It should be noted that, also in the case where a material other than silver chloride is used as a starting material, the silver powder can be obtained in the same manner as in the case of using silver chloride, but, in the case where silver nitrate is used as a starting material, it is necessary to install equipment for collecting nitrous acid gas and equipment for treating nitrate-based nitrogen contained in waste water.

In the method for producing the silver powder, first, a reduction step is performed, the reduction step being such that a silver particle slurry is formed by a wet reduction method in which a silver complex solution containing a silver complex, obtained by dissolving silver chloride with a complexing agent, is mixed with a reducing agent solution, whereby the silver complex is reduced to precipitate silver particles.

In the reduction step, first, silver chloride as a starting material is dissolved using a complexing agent, whereby a silver-complex-containing solution is prepared. The complexing agent is not particularly limited, but, there is preferably used aqueous ammonia, which easily forms a complex with silver chloride and does not contain a component that remains as an impurity. Furthermore, high-purity silver chloride is preferably used.

A method for dissolving silver chloride is such that, for example, in the case where aqueous ammonia is used as a complexing agent, aqueous ammonia may be added to a slurry prepared using silver chloride or the like, but, in order to increase the concentration of a complex and thereby to raise productivity, silver chloride is preferably added to aqueous ammonia and dissolved therein. As the aqueous ammonia to be used for the dissolution, ordinary aqueous ammonia for industrial use may be used, but, aqueous ammonia having a purity as high as possible is preferably used in order to prevent impurity contamination.

Next, a reducing agent solution to be mixed with a silver complex solution is prepared. As a reducing agent, ascorbic acid is preferably used. The use of ascorbic acid enables crystalline particles in silver particles to grow and the specific surface area of a silver powder to be controlled within an appropriate range. Hydrazine or formalin may be used, but, they have stronger reducing power than ascorbic acid, and therefore make crystals in silver particles smaller. Furthermore, in order to control reaction uniformity or reaction rate, there may be used an aqueous solution whose concentration is adjusted by dissolving or diluting a reducing agent with pure water or the like. Furthermore, silver nanoparticles having a size of approximately a few to 100 nm are dispersed in this reducing agent, and, using these nanoparticles as a seed material, a seed growth method may be employed in the reduction step.

In the method for producing the silver powder according to the present embodiment, 1.0% to 3.8% by mass, more preferably 1.0% to 3.5% by mass of a water soluble polymer with respect to silver is added to the reducing agent solution.

As mentioned above, the choice of a water soluble polymer as an aggregation inhibitor and the amount of the water soluble polymer added are of importance to the production of the silver powder according to the present embodiment.

Silver particles (primary particles) formed by reduction using a reducing agent solution have active surfaces, thereby easily coupling to other silver particles to form secondary particles. Furthermore, the secondary particles aggregate to form aggregates. At this time, the use of an aggregation inhibitor having a high effect of preventing aggregation, such as a surface active agent or fatty acid, causes insufficient formation of the secondary particles and the aggregates, whereby the primary particles increase and aggregates having an appropriate size are not formed. On the other hand, the use of an aggregation inhibitor having a low effect of preventing aggregation causes excessive formation of the secondary particles and the aggregates, whereby a silver powder containing excessively aggregating coarse aggregate masses is formed. Unlike these aggregation inhibitors, a water soluble polymer has an appropriate effect of preventing aggregation, and therefore, the adjustment of the amount of a water soluble polymer added allows the formation of the secondary particles and the aggregates to be easily controlled, whereby the aggregates having an appropriate size can be formed in a silver-complex-containing solution obtained after the addition of a reducing agent solution.

The water soluble polymer to be added is not particularly limited, but preferably at least one kind selected from polyethylene glycol, polyvinyl alcohol, polyvinyl pyrrolidone, gelatin, and the like, more preferably at least one kind selected from polyethylene glycol, polyvinyl alcohol, and polyvinyl pyrrolidone. These water soluble polymers prevent particularly excessive aggregation and also prevent silver particles (primary particles) from being made minute due to insufficient aggregation of grown-up nuclei, whereby a silver powder including aggregates having a predetermined size can be easily formed.

Here, a mechanism in which the addition of a water soluble polymer causes silver particles to be connected to each other to form aggregates having a predetermined size is considered as follows. That is, when a water soluble polymer is added, the water soluble polymer adsorbs onto the surfaces of silver particles. At this time, it is considered that, when almost all of the surfaces of the silver particles are coated with a water soluble polymer, each of the silver particles is present independently, but, when the water soluble polymer is added at a predetermined ratio with respect to silver, a part of the surfaces remains without the presence of the water soluble polymer, whereby the silver particles are connected to each other via such surfaces to form aggregates.

Hence, the amount of a water soluble polymer added is set to 1.0% to 3.8% by mass with respect to silver. In the case where the amount of a water soluble polymer added is less than 1.0% by mass with respect to silver, the dispersibility in a silver particle slurry is worsened, whereby a silver powder excessively aggregates to cause the occurrence of many coarse aggregates. On the other hand, in the case where the amount of a water soluble polymer added is more than 3.8% by mass with respect to silver, almost all of the surfaces of silver particles are coated with the water soluble polymer, whereby the silver particles cannot be connected to each other and accordingly aggregates cannot be formed. As a result, a silver powder comprising primary particles is formed, and, also in this case, flakes occur at the time of paste production.

Therefore, the addition of 1.0% to 3.8% by mass of a water soluble polymer with respect to silver enables silver particles to be appropriately connected to each other via the surfaces on which the water soluble polymer is not present, and structurally stable aggregates to be formed, whereby good dispersibility at the time of paste production can be achieved, and also flake occurrence can be effectively prevented. Furthermore, it is more preferable to add a water soluble polymer at 1.0% to 3.5% by mass with respect to silver. An addition amount of 1.0% to 3.5% by mass of a water soluble polymer enables the water soluble polymer to more appropriately adsorb onto the surfaces of silver particles; the silver particles to be connected to each other to the extent that the connected silver particles have a predetermined size thereby to form highly stable aggregates; and flake formation to be more effectively prevented.

Furthermore, the water soluble polymer is preferably added to a reducing agent solution. The addition of the water soluble polymer to a reducing agent solution leads to the water soluble polymer to be present at the stage of nucleation or nucleus growth, and the water soluble polymer to quickly adsorb onto the surfaces of formed nuclei or silver particles, whereby aggregation of the silver particles can be efficiently controlled. Thus, in combination with the foregoing adjustment of the concentration of the water soluble polymer, the advance addition of the water soluble polymer to a reducing agent solution prevents the formation of coarse aggregates due to excessive aggregation of silver particles, and allows silver particles to be more appropriately connected to each other to the extent that the connected silver particles have a predetermined size, thereby forming highly stable aggregates.

It should be noted that a part or a whole amount of the water soluble polymer to be added may be added beforehand to a silver complex containing solution. However, in this case, the water soluble polymer is hardly supplied at the stage of nucleation or nucleus growth, and accordingly there is a risk that the water soluble polymer cannot adsorb appropriately onto the surfaces of silver particles. Therefore, in the case where the water soluble polymer is added beforehand to a silver-complex-containing solution, the amount of the water soluble polymer added is preferably more than 3.0% by mass with respect to silver. Hence, in the case where the water soluble polymer is added to a silver-complex-containing solution, the amount of the water soluble polymer added is preferably more than 3.0% by mass and not more than 10.0% by mass with respect to silver.

The addition of the water soluble polymer sometimes causes foaming at the time of a reduction reaction, and therefore a defoaming agent is preferably added to a silver-complex-containing solution or a reducing-agent-mixed solution. The defoaming agent is not particularly limited, and a defoaming agent that has been commonly used at the time of reduction may be employed. It should be noted that, in order not to inhibit a reduction reaction, the amount of a defoaming agent added is preferably a minimum amount required to achieve defoaming effects.

As for water which is to be used for preparation of a silver-complex-containing solution and a reducing agent solution, in order to prevent contamination with impurities, water from which impurities are removed is preferably used, and pure water is particularly preferably used.

Next, the silver-complex-containing solution and the reducing agent solution which are prepared as mentioned above are mixed to reduce a silver complex, whereby silver particles are precipitated. For this reduction reaction, a batch method may be employed, or a continuous reduction method, such as a tube reactor method or an overflow method, may be employed. To obtain primary particles having a uniform particle diameter, a tube reactor method is preferably used because the method allows particle growth time to be easily controlled. Furthermore, the particle diameter of the silver particles can be controlled by a mixing rate of a silver-complex-containing solution and a reducing agent solution or by a reduction rate of a silver complex, whereby the particle diameter of the silver particles can be easily controlled to a target particle diameter.

In the method for producing the silver powder according to the present embodiment, prior to the formation of coarse aggregate masses caused by further aggregation of aggregates formed by reduction in the silver-complex-containing solution, a surface treatment is preferably applied to the surfaces of the formed aggregates with a treatment agent having a high effect of preventing aggregation thereby to prevent excessive aggregation. In other words, the surface treatment is such that the silver particles are treated with a surface active agent from the reduction of a silver complex until the drying of the silver particles. Alternatively, the silver particles are treated not only with a surface active agent, but also treated with a surface active agent and a dispersing agent at the same time, or treated with a dispersing agent after the treatment by a surface active agent. Preferably, formed silver particles are treated by adding a surface active agent thereto at the time of reduction of a silver complex, and after the reduction, the silver particles are treated with a dispersing agent before drying. Alternatively, after the reduction, the silver particles may be treated with a surface active agent and a dispersing agent. Such treatments enable excessive aggregation to be prevented, the structural stability of desired aggregates to be maintained, and the formation of coarse aggregate masses to be effectively prevented. In the case where a surface treatment is carried out at the time of reduction, a surface active agent and/or a dispersing agent are preferably added to a reducing agent solution as is the case with the addition of the water soluble polymer.

The excessive aggregation of the silver particles proceeds particularly by drying, and therefore the surface treatment performed at any stage before the silver particles are dried is effective. For example, the surface treatment may be performed after the reduction step and before the foregoing washing step, performed simultaneously with the washing step, or performed after the washing step.

Among them, it is particularly preferable to perform the surface treatment after the reduction step and before the washing step or perform after the first washing step. This allows aggregates formed through the reduction treatment and having a predetermined size to be maintained. Furthermore, since the surface treatment is applied to silver particles including the aggregates, a silver powder having good dispersibility can be produced.

More specifically, in the present embodiment, the reduction is carried out by adding a water soluble polymer to a reducing agent solution at a predetermined ratio with respect to silver, whereby the water soluble polymer appropriately adsorbs onto the surfaces of silver particles to form aggregates in which the silver particles are connected to each other and accordingly which have a predetermined size. However, the water soluble polymer adsorbing onto the silver particle surfaces is relatively easily washed by the washing treatment, and therefore, in the case where the washing step is performed prior to the surface treatment, there is a risk that the water soluble polymer on the surfaces of the silver particles is washed and removed, whereby the silver particles start to excessively aggregate each other, and coarse aggregate masses larger than the formed aggregates are formed. Furthermore, the formation of such coarse aggregate masses causes difficulties in giving the surface treatment uniformly to the surfaces of the silver particles.

Hence, in the case where the surface treatment is conducted after the reduction step, when the surface treatment is conducted before the washing step or after the first washing step, excessive aggregation of the silver particles due to the removal of the water soluble polymer can be prevented and also the surface treatment can be efficiently applied to the silver particles including the desirably formed aggregates, whereby a silver powder not including a coarse aggregate and having good dispersibility can be produced.

It should be noted that the surface treatment subsequent to the reduction treatment and prior to the washing step is preferably performed after a slurry containing silver particles is solid-liquid separated using a filter press or the like after the completion of the reduction step. The surface treatment is thus performed after the solid-liquid separation, whereby a surface active agent and a dispersing agent which serve as surface treatment agents can be made to directly act on the silver particles including the aggregates which are formed in a predetermined size, and the surface treatment agent appropriately adsorbs onto the formed aggregates, thereby more effectively preventing the formation of aggregate masses which excessively aggregate.

In this surface treatment step, it is more preferable that the surface treatment is performed using both a surface active agent and a dispersing agent. Such surface treatment using both a surface active agent and a dispersing agent allows a firm surface-treated layer to be formed on the surfaces of silver particles by the interaction of the surface active agent with the dispersing agent, and hence, the surface treatment has a high effect of preventing excessive aggregation, and is effective in maintaining desired aggregates.

As a specific method of a preferable surface treatment using both a surface active agent and a dispersing agent, it is beneficial that silver particles are fed into water to which the surface active agent and the dispersing agent are added, and agitated; or silver particles are fed into water to which the surface active agent is added, and agitated, and then the dispersing agent is added thereto and agitated.

In the case where the surface treatment is performed simultaneously with the washing step, it is beneficial to add a surface active agent and a dispersing agent simultaneously to a washing liquid, or to add a dispersing agent after the addition of a surface active agent. To achieve better adsorption of a surface active agent and a dispersing agent onto silver particles, it is preferable that the silver particles are fed into water or a washing liquid to each of which a surface active agent is added, and agitated, and then furthermore a dispersing agent is added thereto and agitated.

Another way may be such that a surface active agent is fed into a reducing agent solution, and a dispersing agent is fed into a silver particle slurry obtained by mixing a silver-complex-containing solution with the reducing agent solution, and agitated. A stable and uniform surface treatment can be carried out in such a manner that a surface active agent is present at the stage of nucleation or nucleus growth, thereby quickly adsorbing onto the surfaces of formed nuclei or silver particles, and furthermore a dispersing agent is made to adsorb thereonto.

Here, the surface active agent is not particularly limited, but a cationic surface active agent is preferably employed. A cationic surface active agent is ionized to form a positive ion without being affected by pH, and therefore, for example, there is obtained an effect of improving the adsorptivity onto a silver powder obtained by using silver chloride as a starting material.

The cationic surface active agent is not particularly limited, but preferably at least one kind selected from alkyl monoamine salts, typified by monoalkylamine salts; alkyl diamine salts, typified by N-alkyl (C14 to C18) propylenediamine dioleate; alkyl trimethyl ammonium salts, typified by alkyl trimethyl ammonium chloride; alkyl dimethyl benzyl ammonium salts, typified by alkyl dimethyl benzyl ammonium chloride; quaternary ammonium salts, typified by alkyl dipolyoxyethylene methyl ammonium chloride; alkyl pyridinium salts; tertiary amine salts, typified by dimethylstearylamine; polyoxyethylene alkylamine, typified by polyoxypropylene polyoxyethylene alkylamine; diamine oxyethylene adducts, typified by N,N',N'-tris(2-hydroxyethyl)-N-alkyl (C14 to C18)1,3-diaminopropane, and more preferably any of or a mixture of a quaternary ammonium salt and a tertiary amine salt.

Furthermore, the surface active agent preferably has at least one alkyl group having a carbon number of C4 to C36, typified by a methyl group, a butyl group, a cetyl group, a stearyl group, beef tallow, hardened beef tallow, and a plant-based stearyl. As the alkyl group, preferable is an alkyl group to which there is added at least one kind selected from polyoxyethylene, polyoxypropylene, polyoxyethylene polyoxypropylene, polyacrylic acid, and polycarboxylic acid. These alkyl groups can strongly adsorb to fatty acid which is to be used as a later-mentioned dispersing agent, and therefore, in the case where a dispersing agent is made to adsorb to silver particles via a surface active agent, fatty acid can be made to strongly adsorb thereto.

The amount of a surface active agent added is preferably in a range of 0.05% to 1.000% by mass with respect to the silver particles. Almost all amount of the surface active agent adsorbs onto the silver particles, and hence, the addition amount of the surface active agent is almost equal to the adsorption amount thereof. When the amount of a surface active agent added is less than 0.05% by mass, an effect of preventing the aggregation of the silver particles or an effect of improving the adsorptivity of a dispersing agent cannot be obtained. On the other hand, when the amount of a surface active agent added is more than 1.000% by mass, the conductivities of a wiring layer and an electrode which are formed using the silver paste are reduced.

As the dispersing agent, for example, a protective colloid, such as fatty acid, organic metal, or gelatin, may be used, but, fatty acid or a salt thereof is preferably used because fatty acid and a salt thereof incur no risk of impurity contamination and have good adsorptivity to a surface active agent. It should be noted that fatty acid or a salt thereof may be added as an emulsion.

Fatty acid to be used as a dispersing agent is not particularly limited, but preferably at least one kind selected from stearic acid, oleic acid, myristic acid, palmitic acid, linoleic acid, lauric acid, and linolenic acid. This is because these kinds of fatty acid have a comparatively low boiling point and therefore have less adverse effects on a wiring layer and an electrode which are formed using the silver paste.

The amount of a dispersing agent added is preferably in a range of 0.01% to 2.00% by mass, more preferably 0.05% to 1.00% by mass with respect to the silver particles. The amount of a dispersing agent adsorbing onto the silver particles differs depending on the type of the dispersing agent, but, when the amount of a dispersing agent added is less than 0.01% by mass, the dispersing agent sometimes does not adsorb onto the silver powder in an amount large enough to achieve an effect of preventing aggregation of the silver particles or an effect of improving the adsorptivity of the dispersing agent. On the other hand, when the amount of a dispersing agent added is more than 2.00% by mass, too large an amount of the dispersing agent adsorbs onto the silver particles, and therefore a wiring layer and an electrode which are formed using the silver paste sometimes have insufficient conductivity.

Next, the silver particles are washed. Onto the surfaces of the silver particles, a large number of chlorine ions and the water soluble polymer adsorb. Therefore, to achieve sufficient conductivities of a wiring layer and an electrode which are formed using the silver paste, it is preferable that a slurry of the obtained silver particles is washed, whereby excess chlorine ions and an excess water soluble polymer each adsorbing onto the surfaces of the silver particles are removed by the washing. It should be noted that, as mentioned above, in order to prevent the occurrence of excessive aggregation due to the removal of the water soluble polymer adsorbing onto the surfaces of the silver particles, the washing step is preferably performed after the surface treatment step for the silver particles and the like.

A method for the washing is not particularly limited, but, there is commonly used a method in which silver particles separated from the silver particle slurry by solid-liquid separation using a filter press or the like are fed into a washing liquid, and agitated using an agitator or an ultrasonic washer, and then solid-liquid separation is performed again to collect silver particles. Furthermore, to sufficiently remove surface adsorbates, there is preferably repeated several times an operation comprising: feeding into a washing liquid; agitating and washing; and solid-liquid separation.

As the washing liquid, water may be used, or, to efficiently remove chlorine, an alkaline solution may be used. The alkaline solution is not particularly limited, but, a sodium hydroxide solution, which leaves less impurities and is inexpensive, is preferably used. In the case where a sodium hydroxide solution is used as the washing liquid, it is preferable that, after the washing with a sodium hydroxide solution, the silver particles or a slurry thereof is further washed to remove sodium.

The sodium hydroxide solution preferably has a concentration of 0.01 to 0.30 mol/l. A sodium hydroxide solution having a concentration of less than 0.01 mol/l has an insufficient washing effect, on the other hand, a sodium hydroxide solution having a concentration of more than 0.30 mol/l causes sodium having an amount more than allowed to remain in the silver particles. It should be noted that, as the water to be used as a washing liquid, water not containing an impurity element harmful to the silver particles is preferable, and pure water is particularly preferable.

After the washing and the surface treatment, solid-liquid separation is performed to collect silver particles. It should be noted that, as an apparatus to be used for the washing and the surface treatment, a commonly used apparatus, for example, a reaction vessel with an agitator, or the like may be used. Furthermore, as an apparatus to be used for the solid-liquid separation, a commonly used apparatus, for example, a centrifuge, a suction filter, a filter press, or the like may be used.

The collected silver particles are dried by evaporating moisture in a drying step. A method for the drying is such that, for example, a silver powder collected after the completion of the washing and the surface treatment is placed on a stainless steel pad, and heated at a temperature of 40° C. to 80° C. using a commercially available drying apparatus, such as an air oven or a vacuum dryer.

Then, in the method for producing the silver powder according to the present embodiment, a pulverization treatment is applied under light-pulverization conditions to a dried silver powder which is obtained in such a way that the aggregation of silver particles is controlled by the reduction step and preferably the degree of the aggregation is stabilized by the surface treatment. In the silver powder obtained after the foregoing surface treatment, even if the aggregates further aggregate each other due to the drying or the like performed after the surface treatment, the aggregates have a weak bonding strength, and therefore, at the time of paste production, the aggregates are easily separated from each other to the extent that the aggregates have a predetermined size. However, to stabilize the paste, pulverization and classification are preferably performed.

Specifically, the pulverization conditions of the pulverization method are such that, using an apparatus having a low pulverizing power, such as a rolling agitator having a vacuum reduced-pressure atmosphere, silver particles obtained after the drying are pulverized while being agitated at a peripheral speed of an agitating impeller of, for example, 5 to 40 m/s, preferably 5 to 23 m/s. Such light pulverization of the silver powder obtained after the drying can prevent the pulverization of the aggregates which are formed of the silver particles connected to each other and have a predetermined size. When the peripheral speed is less than 5 m/s, pulverization energy is weak, thereby causing a large number of aggregates to remain, on the other hand, when the peripheral speed is more than 40 m/s, pulverization energy is strong, thereby causing too small a number of aggregates to remain, and thus, in both the cases, a silver powder having the foregoing particle size distribution cannot be obtained.

The drying and the pulverization may be simultaneously conducted. For example, a wet cake of the silver particles may be heated in a Henschel mixer under a vacuum pressure-reduced pressure atmosphere, dried while being agitated, and pulverized.

After the foregoing pulverization, classification is performed, whereby a silver powder having a desired particle size or less can be obtained. A classification apparatus to be used for the classification is not particularly limited, and an airflow classifier, a sieve, or the like may be used.

The foregoing silver powder has a dibutyl phthalate absorption amount of 7.0 to 9.5 ml/100 g, the amount being measured by a method of ES-K6217-4; has an oil absorption profile at the time of the measurement of the absorption amount, the profile having two peaks, or one peak having a half width of not more than 1.5 ml/100 g; and has aggregates having an appropriate size which are mixed therein. Therefore, the use of this silver powder achieves a paste having an appropriate viscosity, thereby allowing appropriate kneading to be easily conducted. Furthermore, the silver particles are satisfactorily dispersed in the paste, whereby the occurrence of coarse flakes caused by coarse aggregate masses can be prevented. Thus, a paste which is formed using this silver powder is excellent in printability, and accordingly a conductive film excellent in conductivity can be formed.

EXAMPLES

Hereinafter, specific examples of the present invention will be described. It should be noted that the present invention is not limited to the following examples.

Example 1

In Example 1, while being agitated, 2130 g of silver chloride (manufactured by Sumitomo Metal Mining Co., Ltd., 1440 g of silver contained in the silver chloride) was fed into 36 L of 25% aqueous ammonia maintained at a liquid temperature of 36° C. in a warm bath having a temperature of 38° C., whereby a silver complex solution was prepared. A defoaming agent (ADEKANOL LG-126, manufactured by ADEKA Corporation) was diluted 100 times at a volume ratio, and 18.7 ml of this diluted solution of the defoaming agent was added to the silver complex solution, and the obtained silver complex solution was maintained at a temperature of 36° C. in a warm bath.

On the other hand, 921 g of ascorbic acid (a reagent, manufactured by KANTO CHEMICAL Co., Inc., 56.9% by mass with respect to the silver particles) as a reducing agent was dissolved in 14.61 L of pure water having a temperature of 36° C., whereby a reducing agent solution was prepared. Next, a 40.0 g aliquot of polyvinyl alcohol (PVA205, manufactured by KURARAY Co., Ltd., 2.5% by mass with respect to silver) as a water soluble polymer was taken and dissolved in 1 L of pure water having a temperature of 36° C., and a thus-obtained solution and 1.15 g of polyoxyethylene addition quaternary ammonium salt, a commercial cationic surface active agent, (Cirrasol, manufactured by Croda Japan KK, 0.072% by mass with respect to the silver particles) as a surface treatment agent were mixed with the reducing agent solution.

Next, using a pump capable of quantitative feeding, the prepared silver complex solution and the prepared reducing agent solution were sent to a reaction pipe at 2.7 L/min and 0.9 L/min, respectively, whereby a silver complex was reduced. The reduction rate at this time was 97.2 g/min on a basis of the amount of silver. Furthermore, a ratio of the supply rate of a reducing agent to the supply rate of silver was set to 1.4. It should be noted that a Y-shaped pipe having an inside diameter of 10 mmφ was employed as the reaction pipe. While being agitated, a slurry which contained silver particles obtained by the reduction of the silver complex was received in a receiving tank.

After that, the silver particle slurry obtained by the reduction was solid-liquid separated to collect silver particles, and, into 15.4 L of pure water, there were fed the thus-collected silver particles before drying and 24.5 g of a stearate emulsion comprising stearic acid and palmitic acid as fatty acid and a surface active agent (Selosol 920, manufactured by Chukyo Yushi Co., Ltd., 0.24% by mass of stearic acid and palmitic acid in total with respect to the silver particles) as a dispersing agent; and agitated for 60 minutes to implement a surface treatment. After the surface treatment, the silver particle slurry was filtered using a filter press, whereby the silver particles were solid-liquid separated.

Subsequently, before the collected silver particles are dried, the silver particles were fed into 15.4 L of a 0.05 mol/L sodium hydroxide (NaOH) solution, and agitated for 15 minutes to be washed, and then filtered using a filter press to collect silver particles.

Next, the collected silver particles were fed into 23 L of pure water maintained at a temperature of 40° C., agitated and filtered, and then, a silver particle cake was transferred to a stainless steel pad and dried at a temperature of 60° C. for 10 hours using a vacuum dryer. Then, a 1 to 1.5 kg aliquot of the dried silver powder was taken and fed into a 3 L Henschel mixer (FM3C, manufactured by NIPPON COKE & ENGINEERING Co., Ltd.). In the Henschel mixer, preliminary pulverization was performed for 30 minutes at 2300 revolutions per minute (at a peripheral speed of an agitating impeller of 18.2 m/s), and main pulverization was performed at 2880 revolutions per minute (at a peripheral speed of an agitating impeller of 22.8 m/s), whereby a silver powder was obtained.

Furthermore, the particle size distribution of the obtained silver powder was measured using a laser diffraction scattering type particle size distribution meter (MICROTRAC BRA 9320X-100, manufactured by Nikkiso Co., Ltd.). As a dispersion medium, isopropyl alcohol was used, and the silver powder was fed in the meter and measured while being circulated inside the meter. Usually, a silver slurry dispersed using ultrasonic waves or the like is fed in, but, in Example 1, the evaluation of the dispersibility of a silver powder itself was aimed at, and therefore, approximately 0.1 g of the silver powder was directly fed in the meter and measured. Then, the particle diameter ($D_{50}$) of the particle size distribution on a volume basis obtained by a laser diffraction scattering method was determined.

Furthermore, the silver particles after the pulverization were observed using a scanning electron microscope (JSM-6360L, manufactured by JEOL Ltd.), and the length of approximately 500 silver particles were measured, whereby the mean particle diameter thereof (hereinafter, referred to as $D_{SEM}$) was determined. The specific surface area (hereinafter, referred to as $SA_{SEM}$) of the silver particles was calculated from the mean particle diameter.

A specific surface diameter (hereinafter, referred to as $SA_{BET}$) was determined in such a manner that a specific surface area was measured using a multi-sample BET specific surface area analyzer (Multisorb-16, manufactured by Yuasa Ionics Co., Ltd.), and converted into a BET diameter.

An absorption amount was measured using an absorption meter (S-500 manufactured by Asahisouken Co., Ltd.). The measurement method was in accordance with JIS K6217-4 (2008). FIG. 2 shows the oil absorption profile of an obtained silver powder. The oil absorption profile had one peak having a half width of 1.0 ml/100 g, and the peak resembled a sharp mountain in shape.

As a result of the measurement, the absorption amount was 8.1 ml. Furthermore, the degree of aggregation ($D_{50}/D_{SEM}$) was 2.9, and the area ratio ($SA_{BET}/SA_{SEM}$) was 0.70. A paste of the obtained silver powder was evaluated by kneading using a three-roll mill, and as a result, it was confirmed that the occurrence of flakes was not observed and the paste had good kneadability.

Table 1 shows production conditions in Example 1 (Ag concentration at the time of reduction, an addition amount of PVA, an addition amount of polyoxyethylene addition quaternary ammonium salt, and an addition amount of a dispersing agent).

Example 2

In Example 2, a silver powder was obtained and evaluated in the same manner as in Example 1, except that the production conditions were changed as shown in Table 1.

Figure 3:
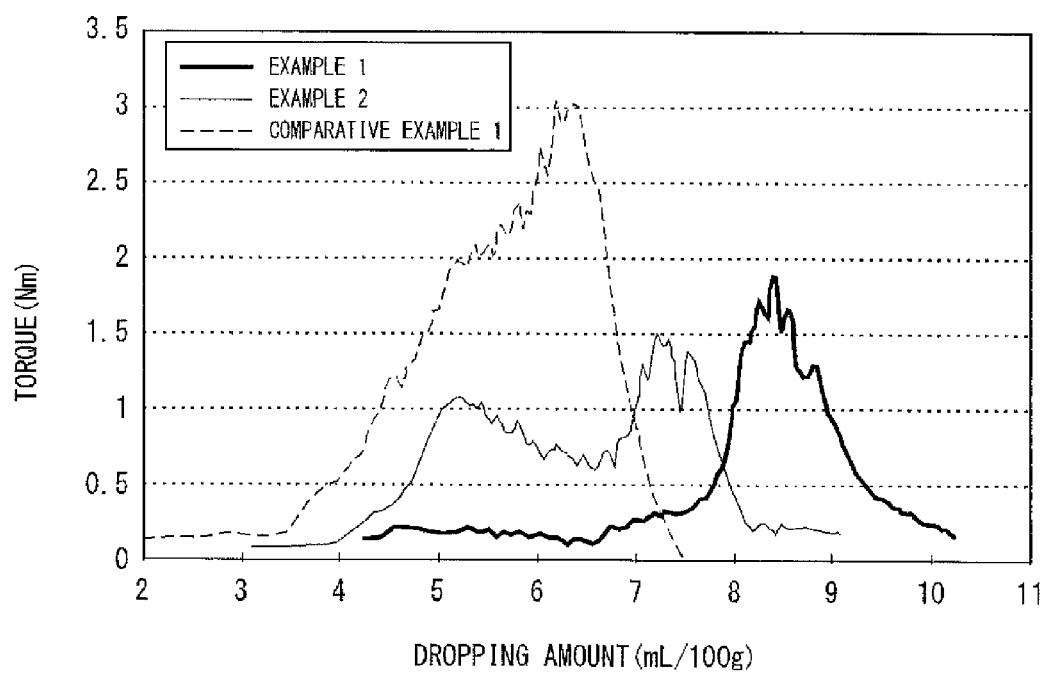
FIG. 3 illustrates the oil absorption profiles of Examples and Comparative Examples.

FIG. 3 illustrates the oil absorption profile of a silver powder of Example 2. The oil absorption profile had two peaks. Furthermore, the silver powder had an absorption amount of 7.0 ml, a degree of aggregation ($D_{50}/D_{SEM}$) of 2.5, and an area ratio ($SA_{BET}/SA_{SEM}$) of 0.69. The torque value of P1 was 1.48 and the torque value of P2 was 1.07, and a relationship P2≤0.75P1 was satisfied, where P1 represents a peak having the highest torque and P2 represents a peak having the second highest torque. Furthermore, the absorption amount in P1 was 7.2, the absorption amount in P2 was 5.2, and the absorption amounts in the respective peaks satisfied a relationship of P2<P1. Furthermore, paste evaluation was conducted, and, as a result, it was confirmed that only very few flakes occurred and there was no problem in kneadability of the paste.

Comparative Example 1

In Comparative Example 1, a silver powder was obtained and evaluated in the same manner as in Example 1, except that the production conditions were changed as shown in Table 1.

FIG. 3 illustrates the oil absorption profile of a silver powder of Comparative Example 1. The oil absorption profile had one peak having a half width of more than 2 ml/100 g. Furthermore, the silver powder had an absorption amount of 5.6 ml, a degree of aggregation ($D_{50}/D_{SEM}$) of 1.9, and an area ratio ($SA_{BET}/SA_{SEM}$) of 0.72. Furthermore, paste evaluation was conducted, and, as a result, it was confirmed that many flakes occurred and the paste had poor kneadability.

Comparative Example 2

In Comparative Example 2, a silver powder was obtained and evaluated in the same manner as in Example 1, except that the production conditions were changed as shown in Table 1 and pulverization was not conducted.

The oil absorption profile of the silver powder of Comparative Example 2 had one peak having a half width of 1.0 ml/100 g as is the case with Example 1, but the silver powder had an absorption amount of 10.0 ml. Furthermore, the silver powder had a degree of aggregation ($D_{50}/D_{SEM}$) of 5.3 and an area ratio ($SA_{BET}/SA_{SEM}$) of 0.77. A paste of the obtained silver powder was evaluated by kneading using a three-roll mill, and as a result, it was confirmed that many flakes occurred and the paste had poor kneadability.

TABLE 1

|  | Ag concentration (g/L) | PVA concentration (%/Ag) | Addition amount of polyoxyethylene addition quaternary ammonium salt (%/Ag) | Addition amount of dispersing agent (%/Ag) |
|---|---|---|---|---|
| Example 1 | 27 | 2.5 | 0.072 | 0.24 |
| Example 2 | 34 | 3.5 | 0.072 | 0.20 |
| Comparative Example 1 | 25 | 4.0 | 0.072 | 0.24 |
| Comparative Example 1 | 23 | 2.5 | 0.048 | 0.13 |

The results of Examples and Comparative Examples reveal that, compare with Comparative Examples 1 and 2, Examples 1 and 2 each contain aggregates having a more appropriately size and have a more appropriate viscous property, and hence are excellent in kneadability. Thus, it is understood that, in Examples 1 and 2, no coarse flake occurs and a paste excellent in printability is achieved. The silver powder adopting the present invention does not cause the formation of flakes at the time of making the silver powder into a paste, and hence it is understood that the silver powder is suitable for a resin-type silver paste and a baked-type silver paste which are applicable to fine-line wiring.

The invention claimed is:

1. A silver powder, having a dibutyl phthalate absorption amount of 7.0 to 9.5 ml/100 g, the amount being measured by a method of JIS-K6217-4; and having an oil absorption profile at the time of measurement of the absorption amount, the profile having two peaks, or one peak having a full width at half maximum of not more than 1.5 ml/100 g, wherein silver particles are pulverized while being agitated at a predetermined speed to obtain silver powder aggregates having a degree of aggregation $D_{50}/D_{SEM}$ of 1.5 to 4.0, the degree being obtained in such a manner that a volume integral 50% diameter ($D_{50}$) measured by a particle-size-distribution measurement method using laser diffraction scattering is divided by a primary particle diameter ($D_{SEM}$) measured using a scanning electron microscope.

2. The silver powder according to claim 1, wherein, in the case where the oil absorption profile has two peaks, torque values of the peaks satisfy a relationship P2≤0.75P1, and absorption amounts at the peaks satisfy a relationship P2<P1, where P1 represents a peak having a highest torque and P2 represents a peak having a second highest torque.

3. The silver powder according to claim 1, wherein the dibutyl phthalate absorption amount is 7.5 to 8.5 ml/100 g.

4. The silver powder according to claim 1, having an area ratio SABET/SASEM of 0.6 to 0.8, the area ratio being obtained in such a manner that a specific surface area (SABET) measured by a BET method is divided by a specific surface area (SASEM) calculated from a primary particle diameter (DSEM) measured using a scanning electron microscope.

* * * * *